United States Patent [19]
Katoh

[11] Patent Number: 5,952,675
[45] Date of Patent: Sep. 14, 1999

[54] THIN FILM TRANSISTOR ELEMENT ARRAY

[75] Inventor: Takuya Katoh, Tokyo, Japan

[73] Assignee: NEC Corporation, Tokyo, Japan

[21] Appl. No.: 08/861,538

[22] Filed: May 22, 1997

[30] Foreign Application Priority Data

May 30, 1996 [JP] Japan ..................................... 8-137153

[51] Int. Cl.$^6$ ................................................. H01L 29/04
[52] U.S. Cl. ............................................. 257/59; 257/72
[58] Field of Search ................................ 257/59, 72, 532

[56] References Cited

U.S. PATENT DOCUMENTS 4,332,075  6/1982  Ota et al. ................................... 29/571

FOREIGN PATENT DOCUMENTS

| 0 349 255 A2 | 1/1990 | European Pat. Off. . |
| 0 526 076 A1 | 2/1993 | European Pat. Off. . |
| 59-501562 | 8/1984 | Japan . |
| 60-261174 | 12/1985 | Japan . |
| 62-500745 | 3/1987 | Japan . |

Primary Examiner—Mark V. Prenty
Attorney, Agent, or Firm—Whitham, Curtis & Whitham

[57] ABSTRACT

Thin film transistor elements are disposed on a substrate in a matrix form. The thin film transistor element includes a source electrode, a drain electrode, isolated layer of a semiconductor layer and a gate insulating film, and a gate electrode. Drain wires and gate wires are provided on the substrate, and they are connected to the drain electrode and source electrode, respectively. Each of intersections of the drain wires and the gate wires has another isolated layer of a semiconductor layer and a gate insulating film. Each of the drain wires has an isolated conductive film which is made of the same material as the gate wires. The conductive film is formed to be contact with each of the drain wires so as to electrically support the drain wires each. Pixel electrodes are provided on the substrate. Each of the pixel electrodes preferably has a overlapping section with the adjacent gate wire and an auxiliary capacitor with another isolated layer of a semiconductor and a gate insulating film is formed on the overlapping section. Any leakage current do not flow between the thin film transistor elements in this thin film transistor elements array because the isolated layers including a semiconductor layer are provide in island form.

13 Claims, 9 Drawing Sheets

THIN FILM TRANSISTOR ELEMENT ARRAY

BACKGROUND OF THE INVENTION

The present invention relates to a thin film transistor element array disposed on an insulating substrate, and more specifically, it relates to the thin film transistor element array having a wire electrode suitable for being used for an active matrix type liquid crystal display.

Recently, the demand of the liquid crystal display has risen. More specifically, since the active matrix type liquid crystal display wherein the thin film transistor is disposed as a switch of each pixel on one glass substrate has a high quality image, more and more demand is growing. In order that such a liquid crystal display may be developed henceforth, the reduction of cost is a critical problem. A manufacturing process is required to be simplified. In an example of the prior art relating to the simplification of a photolithography process, there is disclosed the active matrix type liquid crystal display by the use of the thin film transistor element whose structure can be formed by means of two-time photolithography process.

FIGS. 1A, 1B and 1C are a plan view and a cross sectional view showing the structure of the thin film transistor, a first conventional example used for the active matrix type liquid crystal display, which can be manufactured by means of two-time photolithography process (Japanese Patent National Publication (Kohyo) No. 501562/1984). In the structure according to the conventional example, a portion 1—1 functions as the thin film transistor. An ITO (Indium Tin Oxide) film 21 functions as a signal wire. A metal film 6 functions as a control wire. An ITO film 22 functions as a pixel electrode. Next, the manufacturing process according to the conventional example will be described. A laminated film of the ITO film and an $n^+$ amorphous silicon film are sequentially formed on a transmittable insulating substrate 1. After the photolithography process, a pattern is formed. Next, the laminated film of an amorphous silicon semiconductor film 4, an insulating film 5 and the metal film 6 is formed. After the photolithography process, the pattern is formed. At this time, an $n^+$ amorphous silicon film 3 on the ITO films 21, 22 is also removed. Although six to seven mask patterns are normally necessary, in case of the conventional example, the thin film transistor element array is formed by two-time photolithography process.

As proposed by a second conventional example (Japanese Patent National Publication (Kohyo) No. 500745/1987), when disconnection arises on the ITO film 21 in the first conventional example, the $n^+$ amorphous silicon film 3 is left on one part of the ITO film 21 for a reinforcement. FIGS. 2A, 2B and 2C are a plan view and a cross sectional view to describe the second conventional example. The manufacturing process of the second conventional example is the same as the first conventional example up to the formation of metal films 61 and 62. When the pattern is formed by means of the photolithography process, the laminated film pattern of the $n^+$ amorphous silicon film 3, the amorphous silicon semiconductor film 4, the insulating film 5 and the metal film 62 is left on one part of the ITO film 21, isolating from the thin film transistor element comprising the laminated film pattern of the amorphous silicon semiconductor film 4, the insulating film 5 and the metal film 61. Accordingly, in the second conventional example, as shown in FIG. 2C, a cross sectional view taken on line 3—3 of FIG. 1A, the structure of a signal wire portion is the laminated structure of the ITO film 21, the $n^+$ amorphous silicon film 3, the amorphous silicon semiconductor film 4, the insulating film 5 and the metal film 61. Therefore, even if disconnection arises on the ITO film 21, an electrical connection is held by the $n^+$ amorphous silicon film 3.

FIGS. 3A, 3B and 3C show the structure of a third conventional example which is intended to reduce a resistance of a drain wire. In the structure, a first metal film 10 is disposed on the ITO film 21, whereby the resistance of the drain wire is reduced. The manufacturing method of the conventional example is the same as the first conventional example up to the formation of the pattern of the ITO films 21, 22 and the $n^+$ amorphous silicon film 3. Next, the pattern of the first metal film 10 is formed. Thenceforth, the method is the same as the first conventional example from the formation of the amorphous silicon semiconductor film 4. Accordingly, the resistance of the drain wire can be reduced by means of three-time photolithography process.

According to the first and second conventional examples, the resistance of the signal wire is very high. Accordingly, in case that the examples are applied to a liquid crystal display device having a large screen, there is such a problem that correct images cannot be carried out due to a drain signal delay at a position separated from a signal input terminal. The reason is as follows. According to the first conventional example, the signal wire comprises a single layer of the ITO film 21 having a high resistivity. According to the second conventional example, it is the laminated film of the ITO film 21 and the $n^+$ amorphous silicon film 3 that electrically contributes among the laminated films constituting the signal wire. Accordingly, in both the example, the signal wire has the high resistivity.

Another problem of the first, second third conventional examples is as follows. Since a leakage current flows between the pixel electrode and an adjacent drain electrode wire, a voltage applied to the pixel is dropped, whereby the display of the liquid crystal display is not normal. The reason is that the laminated structure of the amorphous silicon semiconductor film 4, the insulating film 5 and the metal portion 61 is all over the area of a gate electrode wire whereby a parasitic transistor exists between the pixel electrode and the adjacent drain electrode wire.

Moreover, there is a further problem of the first to third conventional examples that an auxiliary capacitance for restraining a change in an electric potential of the pixel electrode cannot be formed. The reason is as follows. In order to form the auxiliary capacitance between the pixel electrode and the one line previous gate electrode, the pixel electrode, that is, the ITO film 22 is overlapped with the one line previous gate electrode wire. In this case, the leakage current flows between the pixel electrode and the drain electrode wire via the parasitic transistor described above, whereby it is difficult to normally hold a pixel potential.

SUMMARY OF THE INVENTION

It is an object of the present invention to provide a thin film transistor element array which can solve the above problems and can reduce a drain signal delay wherein a leakage current between a pixel electrode and an adjacent drain electrode wire is small, an auxiliary capacitance can be disposed between a previous line of gate electrode wires and the pixel electrode (ITO film) and thin film transistor element array can be formed by a small number of masks, and the manufacturing method thereof.

According to one aspect of the present invention, a thin film transistor element array comprises a plurality of thin film transistor elements disposed over a substrate in a matrix including a plurality of rows and columns, each of the thin film transistor elements including a source electrode, a drain electrode, a first laminated layer of a first semiconductor layer and a first gate insulating film, and a gate electrode formed on the first laminated layer, the first laminated layer being provided in island form; a plurality of drain wires provided over the substrate, each of the drain wires being elongated to be connected to the drain electrode of each of the thin film transistor elements disposed in an associated one of the columns; a plurality of gate wires provided over the substrate, each of the gate wires being elongated to be connected to the gate electrode of each transistor elements disposed in an associated one of the rows; a plurality of spacers each provided in island form, each of the spacers being provided at an associated one of intersections of the gate wires and the drain wires so as to insulate each of the gate wires from the drain wires, each of the spacers including a second laminated layer of a second semiconductor layer and a second gate insulating film, and a plurality of isolated conductive films made of the same material as the gate wires, each of said isolated conductive films being formed to be in contact with an associated one of the drain wires.

According to another aspect of the present invention, a thin film transistor element array further comprises each of a plurality of pixel electrodes provided over the substrate to be connected to the source electrode, each of pixel electrodes having a overlapping section with adjacent one of the gate wires; and a plurality of auxiliary capacitors including a third laminated layer of a third semiconductor layer and a third gate insulating film, and the third laminated layer being provided in island form.

The thin film transistor element array according to the present invention is provided with a metal film which is directly disposed on the drain electrode wire. Accordingly, a drain wire resistance is low, so that the delay time of the drain signal is short. In addition, a pattern of an amorphous silicon semiconductor film at the transistor portion is isolated. Accordingly, a parasitic transistor does not exist between the pixel electrode and the adjacent drain electrode, whereby the leakage current do not flow between them. Moreover, the pattern of the amorphous silicon semiconductor film which exists in the overlapping portion of the pixel electrode with the previous line of gate electrode wires is also isolated. Accordingly, it is possible to form an auxiliary capacitor so as not to generates the leakage current between the adjacent drain electrode wire and the auxiliary capacitance.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 8:
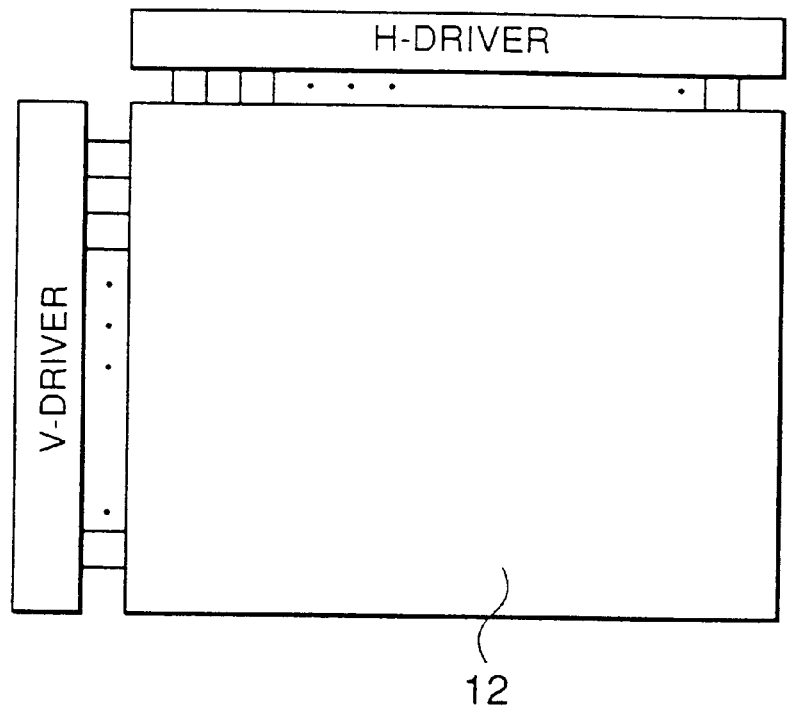
FIG. 8 is a schematic diagram showing a display portion of a liquid crystal display and a driver which drives the display portion.
Figure 9:
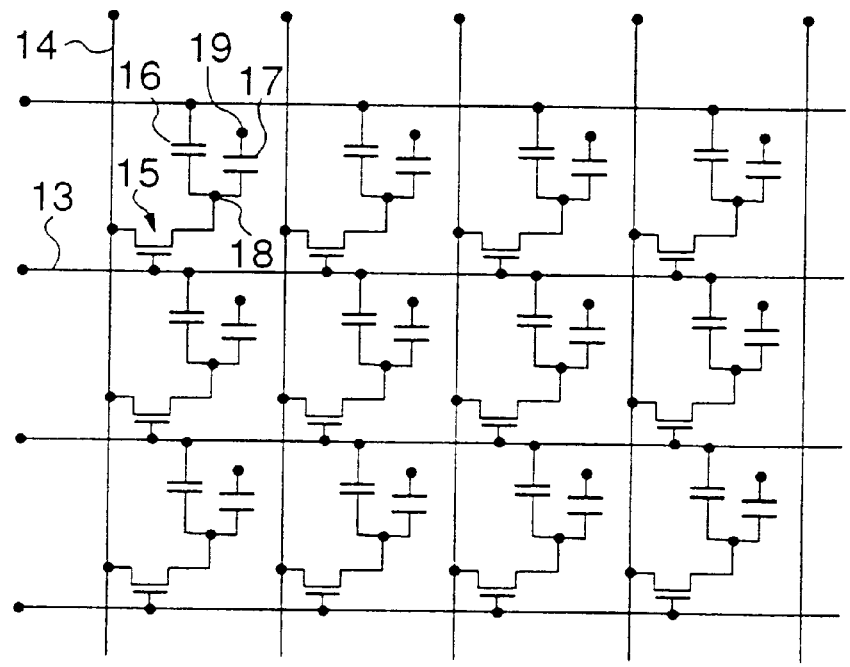
FIG. 9 is a circuit diagram of a thin film transistor element array in the liquid crystal display.

Next, the present invention will be described with reference to the accompanying drawings. In the first place, a liquid crystal display used for a thin film transistor element array of the present invention is described. FIG. 8 is a schematic diagram of the liquid crystal display. In general, the liquid crystal display is provided with a V-driver for vertically scanning at the side of a display portion 12 and an H-driver for horizontally supplying image signals above or under the display portion 12. FIG. 9 is a circuit diagram of the thin film transistor element array used for the display portion 12. The array is provided with a plurality of horizontally elongating gate electrode wires and a plurality of vertically elongating drain electrode wires. The gate electrode wires and the drain electrode wires are connected to the V-driver and the H-driver, respectively. The array has display electrodes 18 in the portion surrounded by the gate electrode wires and the drain electrode wires of the array. Electric charges are supplied to the display electrodes 18 via a thin film transistor element 15. A common electrode 19 is disposed on a opposed substrate (not shown) which is coupled with the substrate where the array is formed. A liquid crystal capacitor 17 is disposed between the display electrode 18 and the common electrode 19. According to the present invention, since an auxiliary capacitor 16 is formed between the a previous line of gate electrode wires, a capability for holding the electric charge is improved. Although the thin film transistor element array of the present invention is applied to the liquid crystal display as described above, the application is not restricted to this example. Henceforth, the thin film transistor element array according to the present invention will described.

Figure 1A:
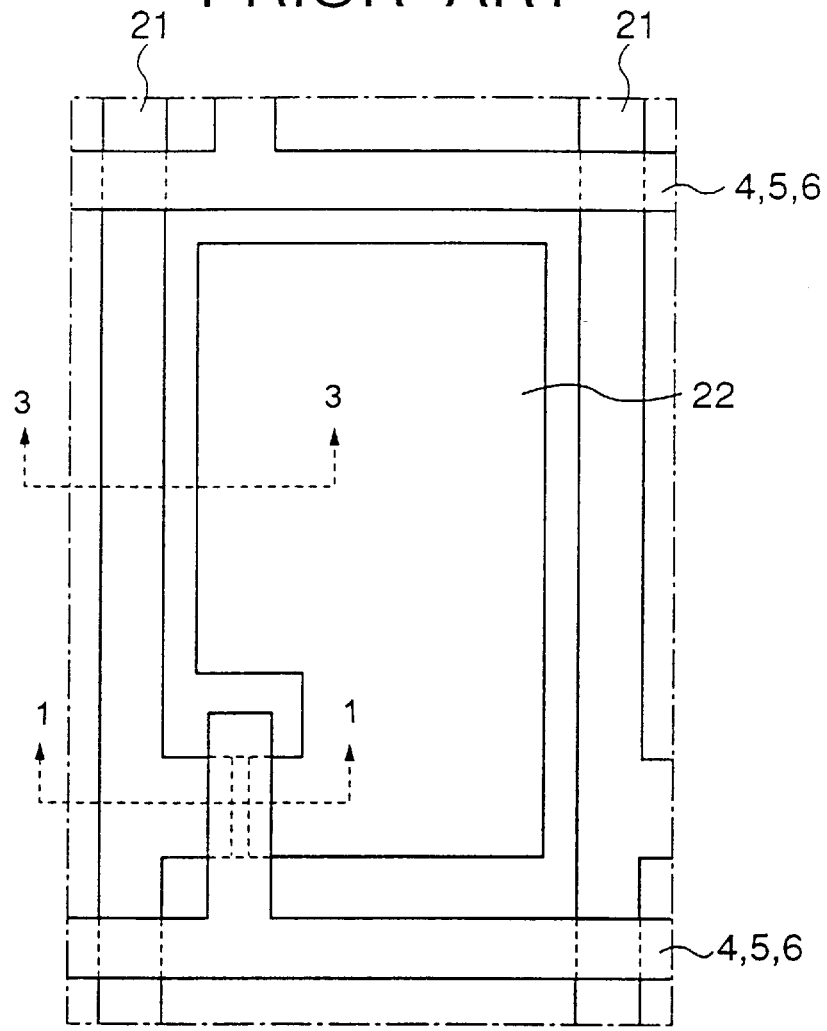
FIG. 1A is a plan view showing a first conventional example.
Figure 1B:
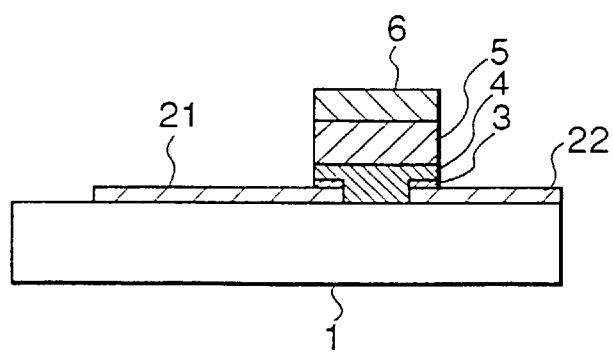
FIG. 1B is a cross sectional view taken on line 1—1 of FIG. 1A.
Figure 1C:
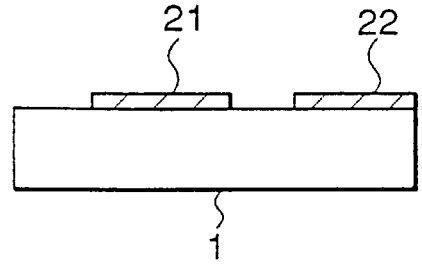
FIG. 1C is a cross sectional view taken on line 3—3 of FIG. 1A.
Figure 2A:
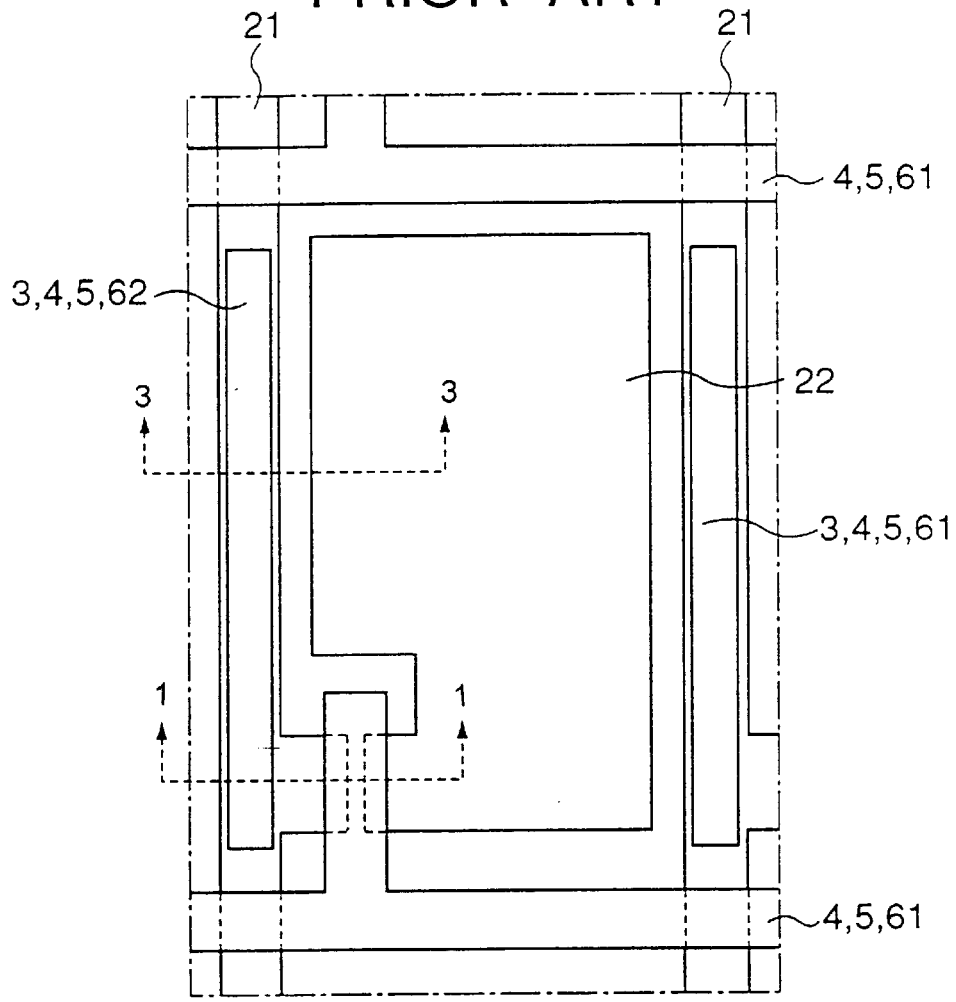
FIG. 2A is a plan view showing a second conventional example.
Figure 2B:
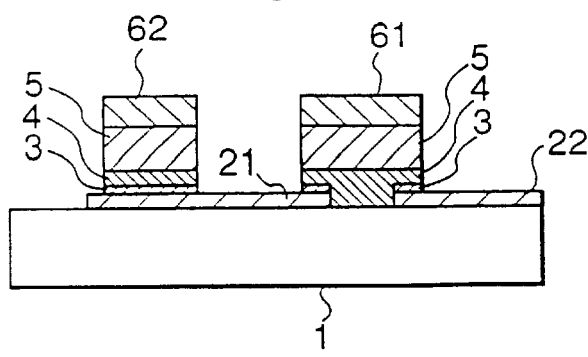
FIG. 2B is a cross sectional view taken on line 1—1 of FIG. 2A.
Figure 2C:
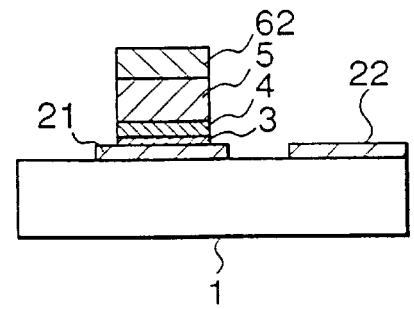
FIG. 2C is a cross sectional view taken on line 3—3 of FIG. 2A.
Figure 3A:
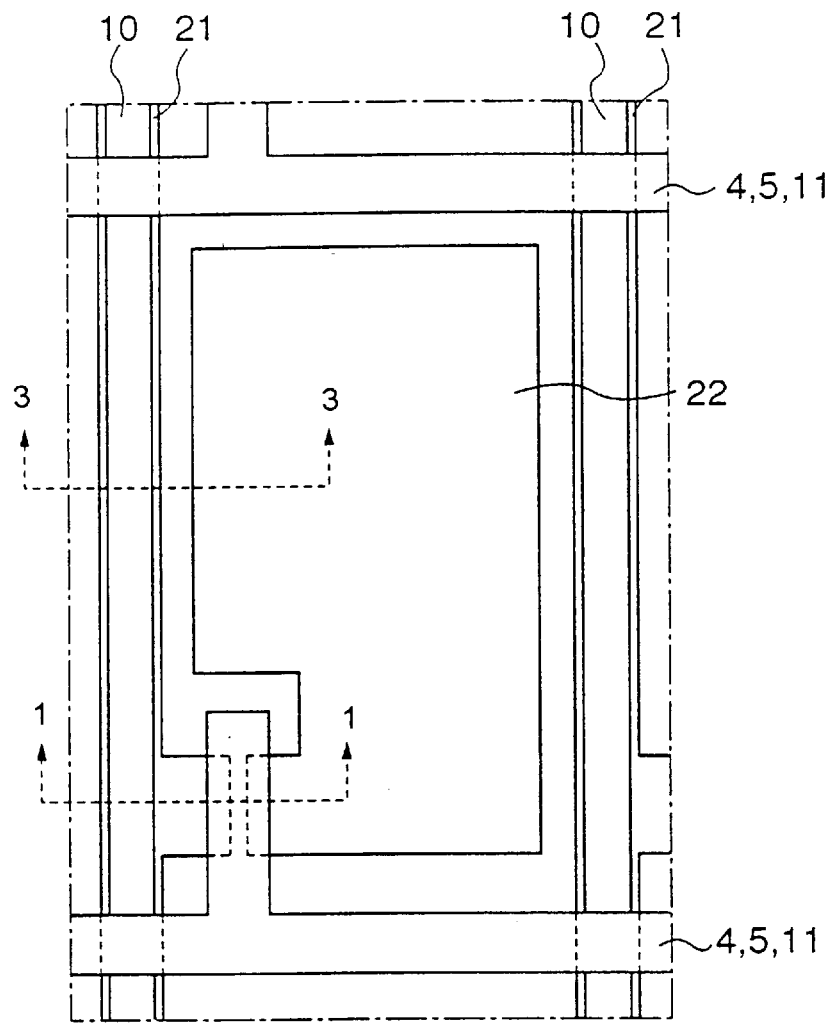
FIG. 3A is a plan view showing a third conventional example.
Figure 3B:
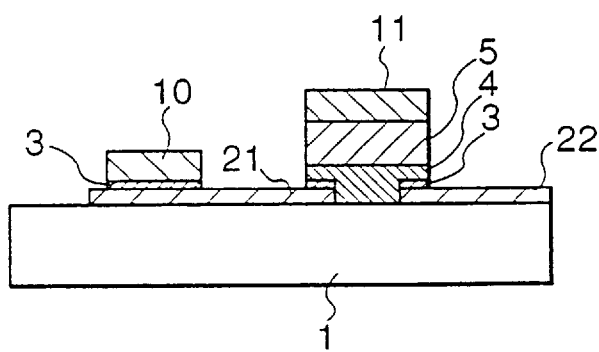
FIG. 3B is a cross sectional view taken on line 1—1 of FIG. 3A.
Figure 3C:
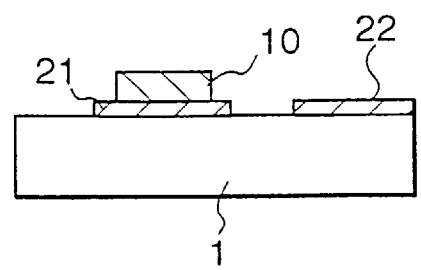
FIG. 3C is a cross sectional view taken on line 3—3 of FIG. 3A.
Figure 4A:
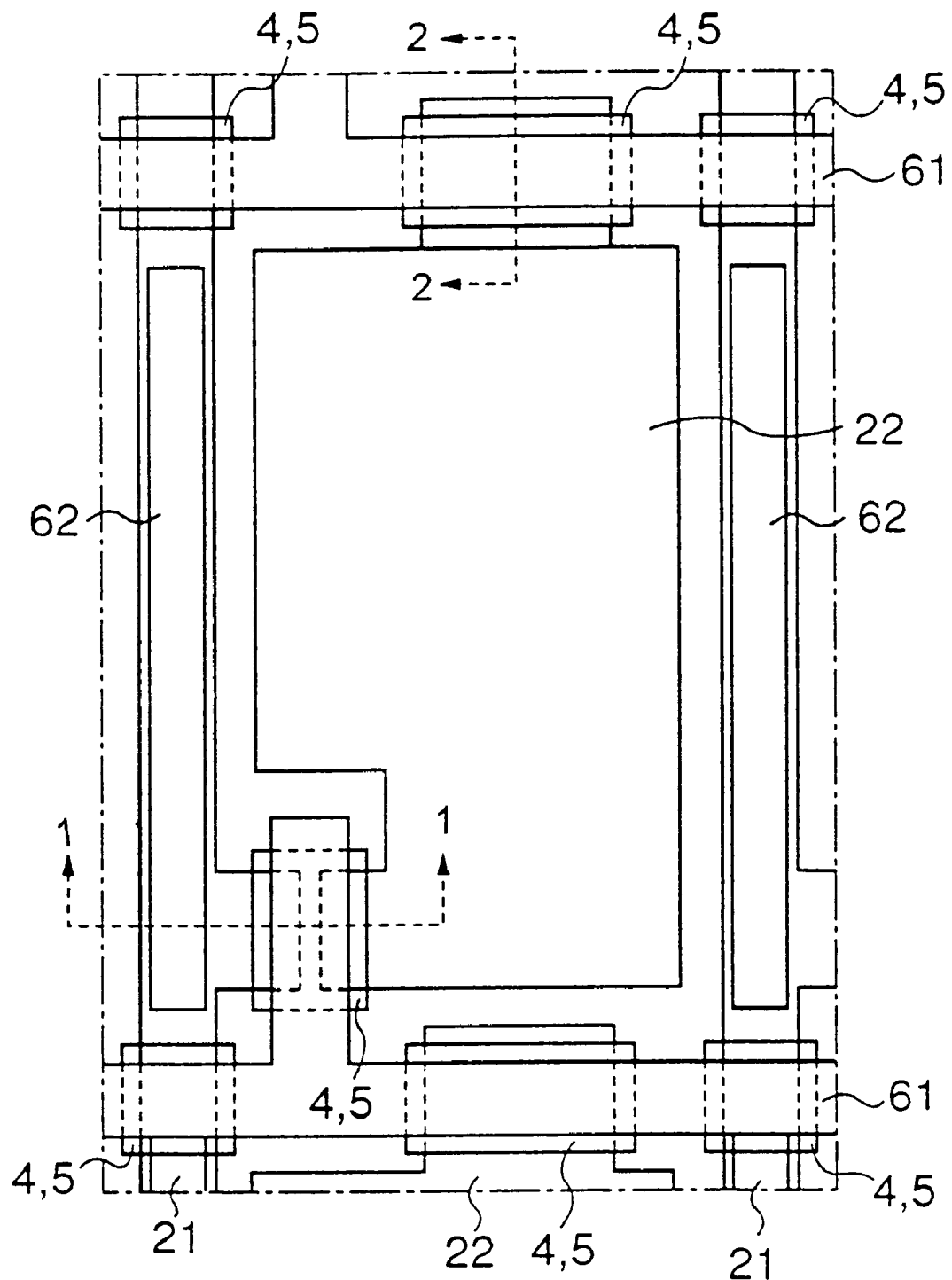
FIG. 4A is a plan view of a first embodiment according to the present invention.
Figure 4B:
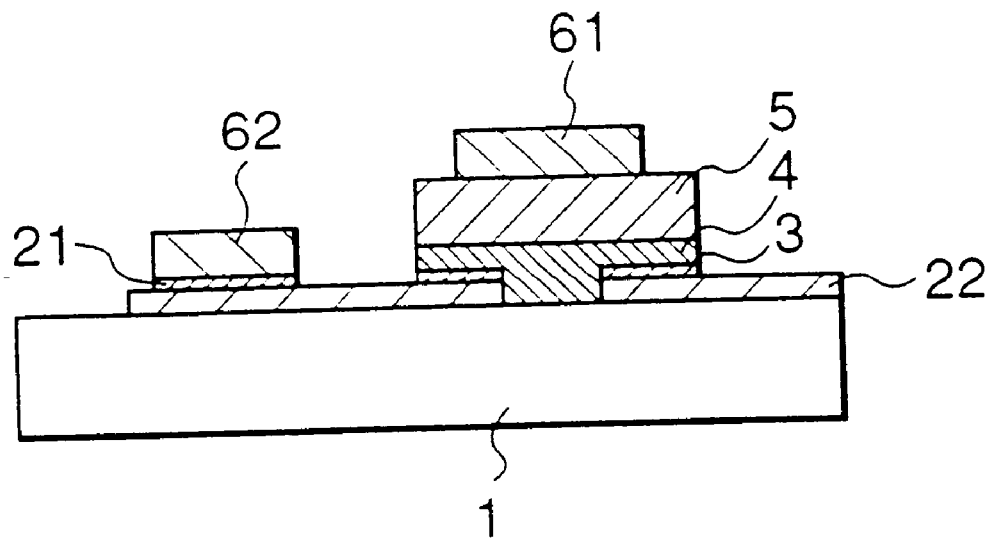
FIG. 4B is a cross sectional view taken on line 1—1 of FIG. 4A.
Figure 4C:
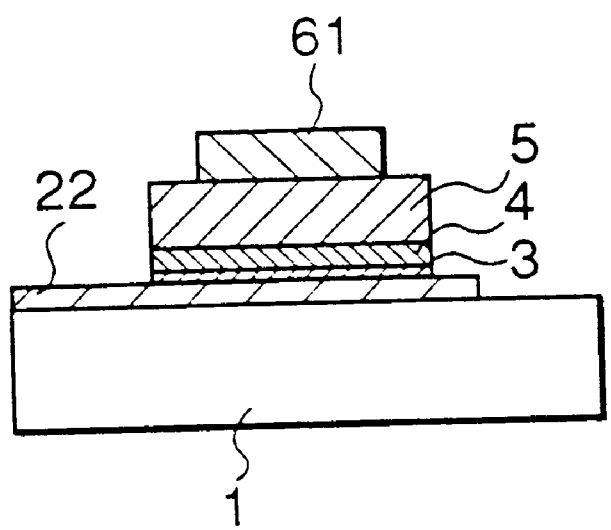
FIG. 4C is a cross sectional view taken on line 2—2 of FIG. 4A.

FIG. 4A is a plan view to describe a first embodiment according to the present invention. FIGS. 4B and 4C are cross sectional views taken on line 1—1 and line 2—2 of FIG. 4A, respectively. The drain electrode wires comprising an ITO film 21 having a thickness of approximately 50 nm and a pixel electrode comprising an ITO film 22 are formed on a transmittable insulating substrate 1 such as a glass. The drain electrode wire has a width of approximately 10 μm. An islandlike-laminated film of an amorphous silicon semiconductor film 4 having the thickness of approximately 50 nm and an insulating film 5 having the thickness of approximately 300 nm is disposed between the ITO film 21 and the ITO film 22. The laminated film is formed in isolation. An n+ amorphous silicon film 3 having the thickness of approximately 10 nm is formed in a contact portion of the ITO films 21, 22 with the amorphous silicon semiconductor film 4. A metal film 61 is formed on the insulating film 5. The thin film transistor comprises the ITO films 21, 22, the n+ amorphous silicon film 3, the amorphous silicon semiconductor film 4, the insulating film 5 and the metal film 61.

Since the islandlike pattern of the amorphous silicon semiconductor film 4 is formed in isolation, a parasitic transistor does not exist between the adjacent drain electrode wire and the amorphous silicon semiconductor film. Accordingly, the thin film transistor is constituted in such a manner that a leakage current does not flow between the pixel electrode and the adjacent drain electrode wire. Furthermore, the adjacent gate electrode wire and the pixel electrode have an overlapping section with each other. The islandlike-pattern of the laminated film of the n+ amorphous semiconductor film 3, the amorphous silicon semiconductor film 4 and the insulating film 5 is disposed in isolation between the pixel electrode and the gate electrode wire in the overlapping section. This part functions as the auxiliary capacitor for restraining a potential of the pixel electrode from dropping. Accordingly, in the structure of the first embodiment. a high reliability can be obtained. Since the islandlike pattern of the laminated film is disposed in isolation, the leakage current does not flow between the auxiliary capacitance and the adjacent drain electrode wire. Additionally, the amorphous silicon semiconductor film 4 and the insulating film 5 are also disposed, in isolation,like island form between the drain electrode wire and the gate electrode wire in the intersection of the gate electrode wire and the drain electrode wire. The amorphous silicon semiconductor film 4 and the insulating film 5 function as a insulating film. Furthermore, a metal film 62 having a low resistance is directly formed on the ITO film 21 to be in contact with the drain electrode wire. Therefore, since a wire resistance of the drain electrode wire is reduced, a signal delay can be reduced.

As described above, since the thin film transistor element array of the first embodiment is provided with the auxiliary capacitor between the a previous line of gate electrode wires and the pixel electrode (ITO film), the reliability is high. Since the parasitic transistor does not exist, the leakage current does not flow between the auxiliary capacitance and the drain electrode wire, and between the pixel electrode and the adjacent drain electrode wire. Moreover, the wire resistance of the drain electrode wire can be reduced. Accordingly, the structure of the first embodiment is suitable for enlarging the screen of the liquid crystal display. Furthermore, the high reliability can be obtained.

Next, a manufacturing method according to the first embodiment will be described with reference to the accompanying drawings. FIGS. 5A to 5I are a plan view or a cross sectional view to describe a manufacturing process according to the first embodiment, respectively. As shown in the plan view of FIG. 5A and FIGS. 5B and 5C, that is, cross sectional views taken on line 1—1 and line 2—2 of FIG. 5A, the approximately 50 nm ITO film is formed on the transmittable insulating substrate 1 by means of a sputtering method. Next, the approximately 10 nm n+ amorphous silicon film 3 is formed by means of a CVD method. Through a usual photolithography process, the drain electrode wire pattern and the pixel electrode pattern are formed. The drain electrode wire pattern and the pixel electrode pattern are a laminated structure of the ITO films 21, 22 and the n+ amorphous silicon film 3.

Figure 5A:
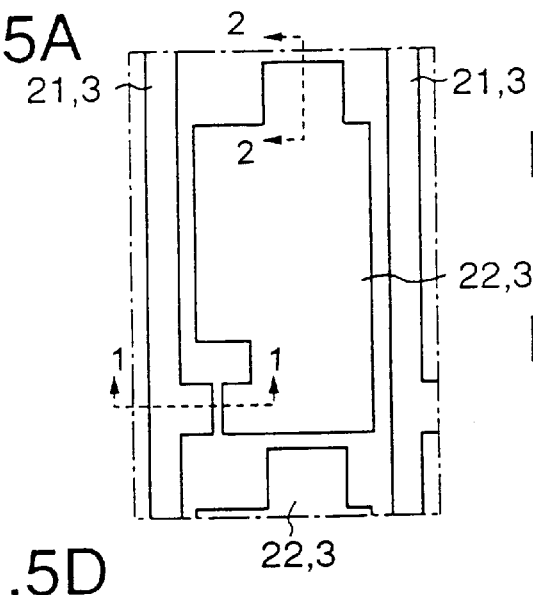
FIGS. 5A, 5D and 5G are plan views to describe a manufacturing method of the first embodiment according to the present invention.
Figure 5B:
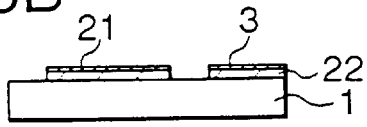
FIGS. 5B, 5E and 5H are cross sectional views taken on line 1—1 of FIGS. 5A, 5D and 5G, respectively.
Figure 5C:
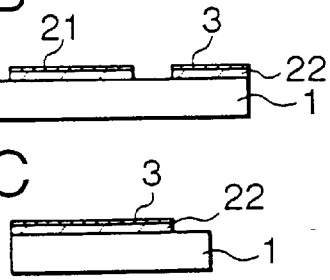
FIGS. 5C, 5F and 5I are cross sectional views taken on line 2—2 of FIGS. 5A, 5D and 5G, respectively.
Figure 5D:
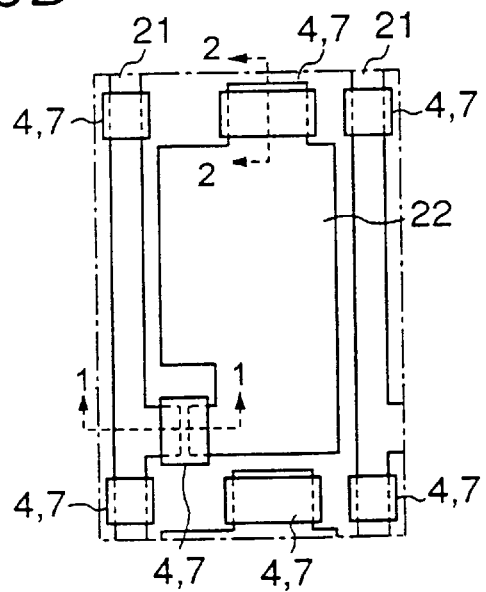
Figure 5E:
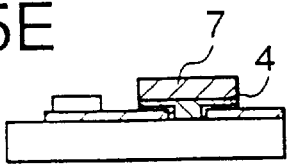
Figure 5F:
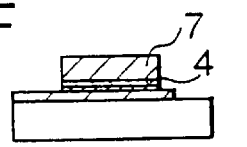

As shown in plan views of FIGS. 5D and 6D and FIGS. 5E and 5F, that is, cross sectional views taken on line 1—1 and line 2—2 of FIG. 5D, the approximately 50 nm amorphous silicon semiconductor film 4 and an approximately 300 nm silicon nitrided film 7 are formed by means of the CVD method. After the usual photolithography process, the laminated film pattern of the semiconductor layer and the gate insulating film, the capacitance insulating film pattern of the auxiliary capacitance formed between the pixel electrode and the gate electrode wire, and the interlaminar separation insulating film pattern in the crossing portion of the drain electrode wire and the gate electrode wire are formed at a time. All the laminated film pattern, the capacitance insulating film pattern and the interlaminar separation insulating film pattern includes the laminated film pattern of the amorphous silicon semiconductor film 4 and the silicon nitrided film 7.

Figure 5G:
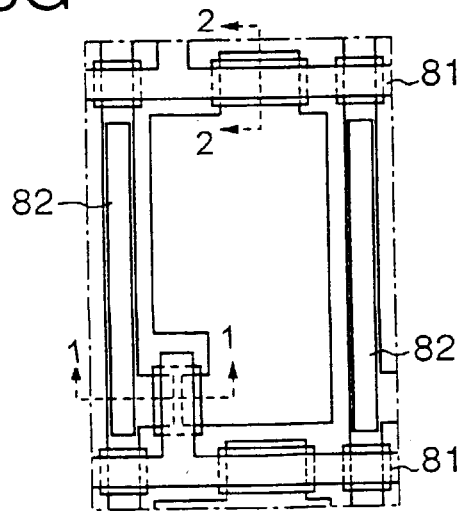
Figure 5H:
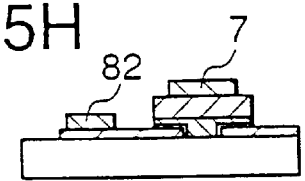
Figure 5I:
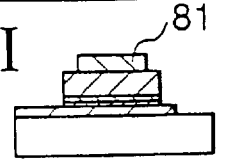

Next, as shown in the plan view of FIG. 5G and FIGS. 5H and 5I, that is, cross sectional views taken on line 1—1 and line 2—2 of FIG. 5G, an approximately 200 nm chromium film is formed by means of the sputtering method. The usual photolithography process is carried out. Henceforth, the gate electrode wire pattern comprising a chromium film 81 is formed, and, at the same time, the pattern having a remaining chromium film 82 is also formed on the drain electrode wire.

According to the method described above, it is possible to achieve the thin film transistor element array having the auxiliary capacitance between the a previous line of gate electrode wires and the pixel electrode (ITO film) wherein the leakage current does not flow between the auxiliary capacitance and the drain electrode wire and between the pixel electrode and the adjacent drain electrode wire, and the wire resistance of the drain electrode wire is lower enough. According to the manufacturing method of the first embodiment, the laminated film pattern of the semiconductor layer of the thin film transistor and the gate insulating film, the capacitance insulating film pattern of the auxiliary capacitance and the interlaminar separation insulating film pattern can be formed at the same time. In addition, the gate electrode wire pattern and the pattern which reduces the resistance of the drain electrode wire can be formed at the same time. Therefore, only three photolithography processes are required to be carried out. Accordingly, the manufacturing method is greatly amplified.

Figure 6A:
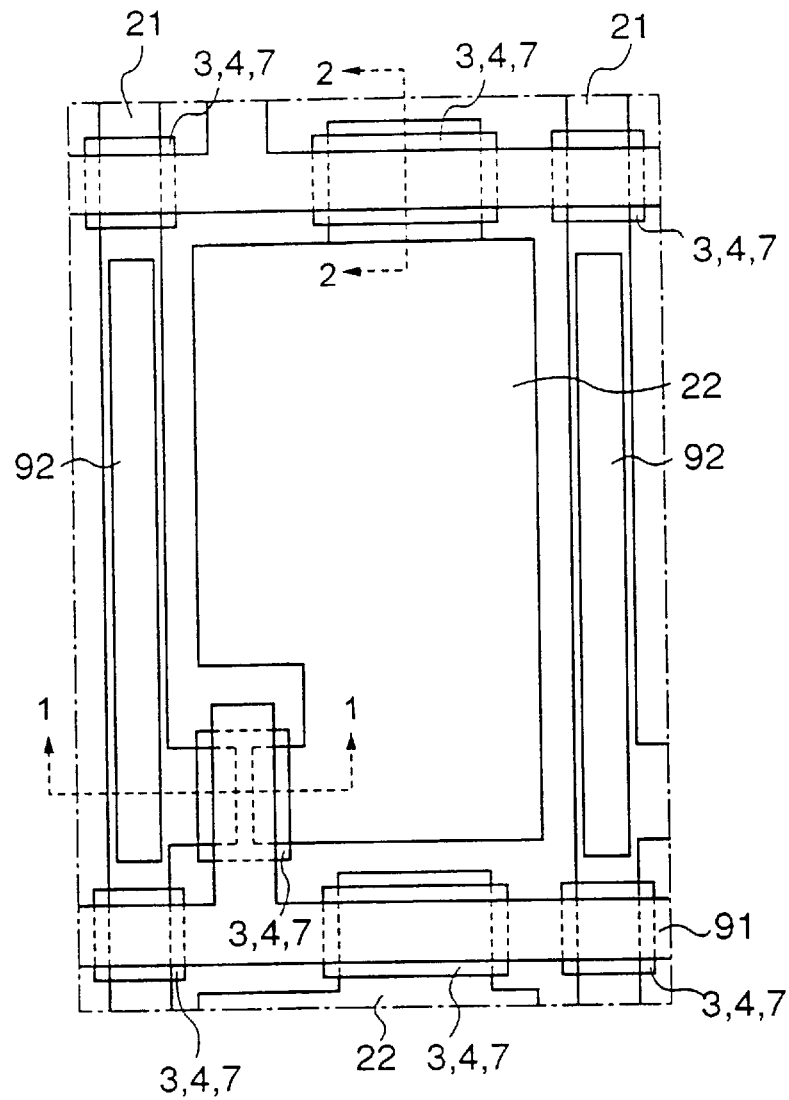
FIG. 6A is a plan view of a second embodiment according to the present invention.
Figure 6B:
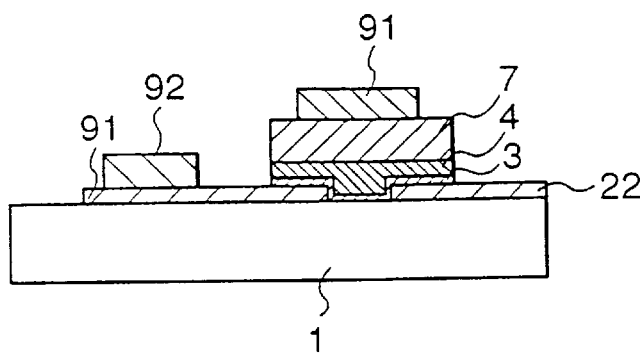
FIG. 6B is a cross sectional view taken on line 1—1 of FIG. 6A.
Figure 6C:
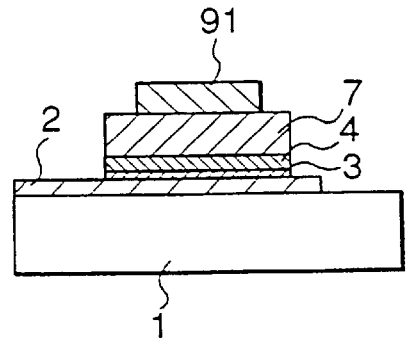
FIG. 6C is a cross sectional view taken on line 2—2 of FIG. 6A.

FIGS. 6A, 6B and 6C are a plan view and a cross sectional view to describe a second embodiment according to the present invention. The difference between the first and second embodiments is that the n⁺ amorphous silicon film 3 is formed all over the area on the lower side of the amorphous silicon semiconductor film 4. According to the first embodiment, the n⁺ amorphous silicon film 3 is only formed on the upper side of the ITO film 2. On one hand, according to the second embodiment, the n⁺ amorphous silicon film 3 has a very thin thickness of approximately 1 nm. An off resistance of the transistor can be maintained to be high. Moreover, according to the second embodiment, an aluminum film 91 is used as a gate metal film, whereby the wire resistance of the gate electrode wire is far lower. Furthermore, since the metal film being in contact with the drain electrode wire is also an aluminum film 92, the wire resistance of the drain electrode wire is far lower. Similarly to the first embodiment, the thin film transistor element array according to the second embodiment has the auxiliary capacitance between the a previous line of gate electrode wires and the pixel electrode (ITO film). The leakage current does not flow between the auxiliary capacitance and the drain electrode, and between the pixel electrode and the adjacent drain electrode wire.

Next, the manufacturing method according to the second embodiment will be described referring to the accompanying drawings. FIGS. 7A to 7I are a plan view and a cross sectional view to describe the manufacturing process according to the second embodiment. As shown in the plan view of FIG. 7A and FIGS. 7B and 7C, that is, cross sectional views taken on line 1—1 and line 2—2 of FIG. 7A, the approximately 50 nm ITO film is formed on the transmittable insulating substrate 1 by the sputtering method. Through the usual photolithography process, the drain electrode wire pattern comprising the ITO film 21 and the pixel electrode pattern comprising the ITO film 22 are formed.

Figure 7A:
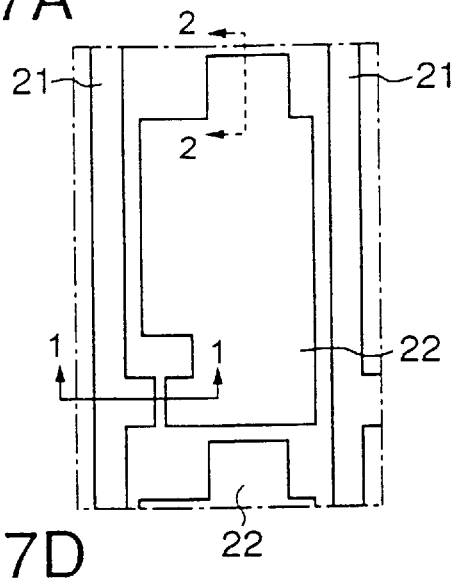
FIGS. 7A, 7D and 7G are plan views to describe the manufacturing method of the second embodiment according to the present invention.
Figure 7B:
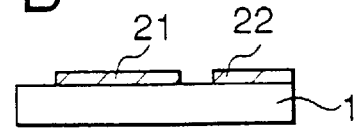
FIGS. 7B, 7E and 7H are cross sectional views taken on line 1—1 of FIGS. 7A, 7D and 7G, respectively.
Figure 7C:
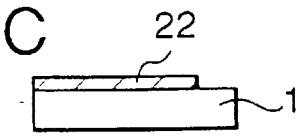
FIGS. 7C, 7F and 7I are cross sectional views taken on line 2—2 of FIGS. 7A, 7D and 7G, respectively.
Figure 7D:
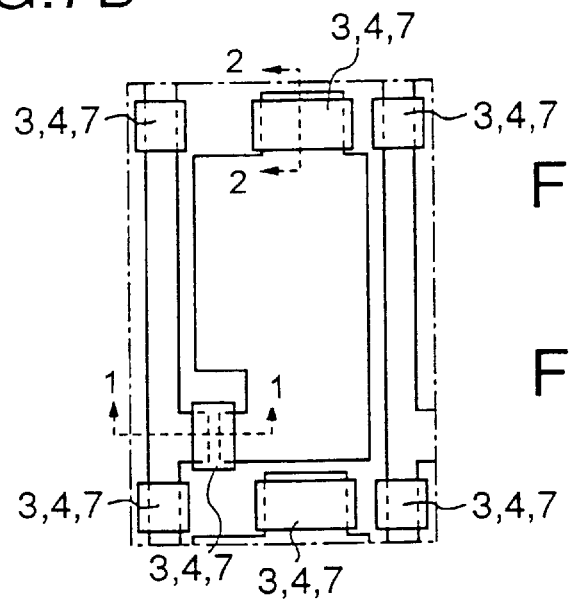
Figure 7E:
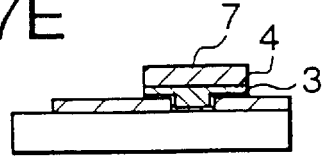
Figure 7F:
Figure 7G:
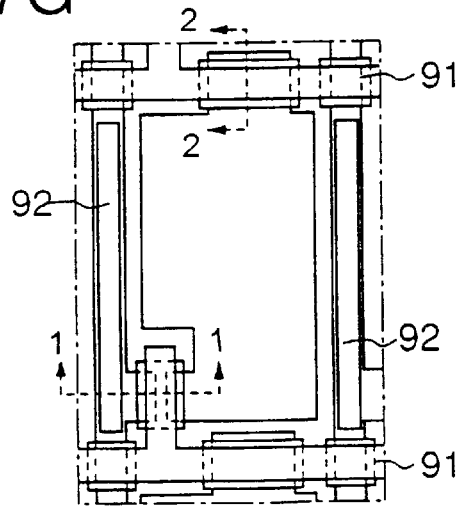
Figure 7H:
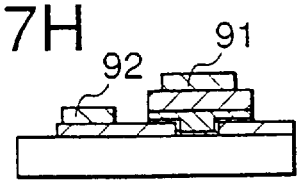
Figure 7I:
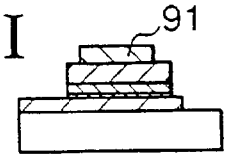

Next, as shown in the plan view of FIG. 7D and FIGS. 7E and 7F, that is, cross sectional views taken on line 1—1 and line 2—2 of FIG. 7D, a plasma treatment is performed with PH₃ gas added into Ar gas by the Plasma Enhanced CVD method, and phosphorus is doped all over the surface. Next, the approximately 50 nm amorphous silicon semiconductor film 4 and the approximately 30 nm silicon nitrided film 7 are deposited, so that the phosphorus is diffused into the amorphous silicon semiconductor film 4. The laminated film of the n⁺ amorphous silicon film 3, the amorphous silicon semiconductor film 4 and the silicon nitrided film 7 are formed. Through the usual photolithography process, the laminated film pattern of the n⁺ amorphous silicon film 3 of the transistor, the amorphous silicon semiconductor film 4 and the silicon nitrided film 7, that is, the gate insulating film, and the insulating film pattern of the auxiliary capacitance formed between the pixel electrode and the gate electrode wire, and the interlaminar separation insulating film pattern at the intersection of the drain electrode wire and the gate electrode wire are formed at the same time. Next, as shown in the plan view of FIG. 7G and FIGS. 7H and 7I, that is, cross sectional views taken on line 1—1 and line 2—2 of FIG. 7G, the approximately 10 nm aluminum film is formed by means of the sputtering method. Through the usual photolithography process, the gate electrode pattern made of the aluminum film 91 is formed, and, at the same time, the pattern having the remaining aluminum film 92 is also formed on the drain electrode wire.

According to the method described above, the thin film transistor element array shown in FIGS. 6A, 6B and 6C can be achieved. According to the manufacturing method of the second embodiment, similarly to the first embodiment, only three photolithography processes is required. Furthermore, according to the manufacturing method of the first embodiment, a growth process of the n⁺ amorphous silicon film is independently required, however, according to the manufacturing method of the second embodiment, it is possible to continuously deposite the n⁺ amorphous silicon film 3, the amorphous silicon semiconductor film 4 and the silicon nitrided film 7 by a series of CVD process. That is to say, according to the second embodiment, it can be less CVD process by one time than the manufacturing method of the first embodiment. Accordingly, the manufacturing method can be further simplified.

According to the first and second embodiments described above, each case have been described where the gate metal film is the chromium film or the aluminum film. The metal film of the present invention is not restricted to the two kinds of films. A tantalum film, a molybdenum film, a tungsten film or various alloy films are suitable for the metal film.

According to the present invention, the wire resistance of the drain electrode wire can be lower enough, and the signal delay time can be reduced. Accordingly, even if the size of the screen is enlarged, normal images can be obtained on the liquid crystal display apparatus. The reason is that one part of the drain electrode wire comprises the laminated structure of the ITO film and the gate metal film whereby the wire resistance of the drain electrode wire is low since the drain electrode wire is supported by the gate metal film.

Furthermore, according to the present invention, the leakage current does not flow between the pixel electrode and the adjacent drain electrode wire. Accordingly, a normal electric potential can be given into the pixel, and the liquid crystal display apparatus can normally display images. The reason is that the parasitic transistor does not exist between the pixel electrode and the adjacent drain electrode wire.

Moreover, according to the present invention, the auxiliary capacitor for restraining changes from dropping in electric the pixel electrode can be disposed. The liquid crystal display apparatus having a high reliability can be provided. The reason is that the parasitic transistor does not exist between the auxiliary capacitance and the drain electrode wire. Furthermore, according to the present invention, since the simplified manufacturing process can be used, a manufacturing cost can be reduced. The reason is that the laminated film pattern of the semiconductor layer of the thin film transistor and the gate insulating film, the capacitance insulating film pattern of the auxiliary capacitance and the interlaminar separation insulating film pattern can be formed at the same time. The further reason is that the gate electrode wire and the electrode pattern which reduces the resistance of the drain electrode wire can be formed at the same time.

What is claimed is:

1. A thin film transistor element array comprising:

a plurality of thin film transistor elements disposed over a substrate in a matrix including a plurality of rows and columns, each of said thin film transistor elements including a source electrode, a drain electrode, a first laminated layer of a first semiconductor layer and a first gate insulating film, and a gate electrode formed on said first laminated layer, said first laminated layer being provided in island form;

a plurality of drain wires provided over said substrate, each of said drain wires being elongated to be connected to said drain electrode of each of the thin film transistor elements disposed in an associated one of said columns;

a plurality of gate wires provided over said substrate, each of said gate wires being elongated to be connected to said gate electrode of each of the thin film transistor elements disposed in an associated one of said rows;

a plurality of spacers each provided in island form, each of said spacers being provided at an associated one of intersections of said gate wires and said drain wires so as to insulate each of said gate wires from each of said drain wires, each of said spacers including a second laminated layer of a second semiconductor layer and a second gate insulating film; and a plurality of isolated conductive films made of the same material as said gate wires, each of said isolated conductive films being formed to be in contact with an associated one of said drain wires.

2. A thin film transistor element array comprising:

a plurality of thin film transistor elements disposed over a substrate in a matrix including a plurality of rows and columns, each of said thin film transistor elements including a source electrode, a drain electrode, a first laminated layer of a first semiconductor layer and a first gate insulating film, and a gate electrode on said first laminated layers, said first laminated layer being provided in island form;

a plurality of drain wires provided over said substrate, each of said drain wires being elongated to be connected to said drain electrode of each of the thin film transistor elements disposed in an associated one of said columns;

a plurality of gate wires provided over said substrate, each of said gate wires being elongated to be connected to said gate electrode of each of the thin film transistor elements disposed in an associated one of said rows;

a plurality of spacers each provided in island form, each of said spacers being provided at an associated one of intersections of said gate wires and said drain wires so as to insulate each of said gate wires from each of said drain wires, and each of said spacers including a second laminated layer of a second semiconductor layer and a second gate insulating film;

a plurality of pixel electrodes provided over said substrate to be electrically connected to said source electrode, each of pixel electrodes having a overlapping section with an adjacent one of said gate wires; and a plurality of auxiliary capacitors, each of said auxiliary capacitors being formed on said overlapping section, each of said auxiliary capacitors including a third laminated layer of a third semiconductor layer and a third gate insulating film, and said third laminated layer being provided in island form.

3. The thin film transistor element array as claimed in claim 2, further comprising a plurality of isolated conductive films made of the same material as said gate wires, each of said isolated conductive films being formed to be contact with an associated one of said drain wires.

4. The thin film transistor element array as claimed in claim 1, wherein said substrate is one of the substrates for a liquid crystal display apparatus, said gate wire and said drain wire being connected to a vertical driver and a horizontal driver of said liquid crystal display apparatus, respectively.

5. The thin film transistor element array as claimed in claim 1, wherein said substrate is transmittable.

6. The thin film transistor element array as claimed in claim 1, further comprising an $n^+$ type semiconductor film, said $n^+$ type semiconductor film being provided in one part on the lower side of said first semiconductor layer.

7. The thin film transistor element array as claimed in claim 2, further comprising an $n^+$ type semiconductor film, said $n^+$ type semiconductor film being sandwiched between said first semiconductor layer and each of said pixel electrodes.

8. The thin film transistor element array as claimed in claim 1, further comprising an $n^+$ type semiconductor film all over the lower side of said first semiconductor layer.

9. The thin film transistor element array according to claim 1, wherein said first semiconductor layer comprises an amorphous silicon film and has an area where phosphorus is diffused in one part on the lower side of said first semiconductor layer.

10. The thin film transistor element array as claimed in claim 2, wherein said pixel electrodes are made of transparent conductive materials.

11. The thin film transistor element array as claimed in claim 2, wherein said pixel electrodes are made of ITO.

12. The thin film transistor element array as claimed in claim 1, wherein said drain wires are made of transparent conductive materials.

13. The thin film transistor element array as claimed in claim 1, wherein said drain wires are made of ITO.

* * * * *